(12) United States Patent
Schuermyer et al.

(10) Patent No.: US 9,703,658 B2
(45) Date of Patent: Jul. 11, 2017

(54) IDENTIFYING FAILURE MECHANISMS BASED ON A POPULATION OF SCAN DIAGNOSTIC REPORTS

(71) Applicant: Synopsys, Inc., Mountain View, CA (US)

(72) Inventors: Christopher W. Schuermyer, Happy Valley, OR (US); Karen Movsisyan, Abovyan (AM)

(73) Assignee: SYNOPSYS, INC., Mountain View, CA (US)

( * ) Notice: Subject to any disclaimer, the term of this patent is extended or adjusted under 35 U.S.C. 154(b) by 77 days.

(21) Appl. No.: 14/929,033

(22) Filed: Oct. 30, 2015

(65) Prior Publication Data

US 2017/0052861 A1 Feb. 23, 2017

Related U.S. Application Data

(60) Provisional application No. 62/208,096, filed on Aug. 21, 2015.

(51) Int. Cl.
*G06F 11/26* (2006.01)
*G06F 11/22* (2006.01)

(52) U.S. Cl.
CPC .......... *G06F 11/26* (2013.01); *G06F 11/2268* (2013.01)

(58) Field of Classification Search
CPC ............................. G06F 11/26; G06F 11/2268
See application file for complete search history.

(56) References Cited

U.S. PATENT DOCUMENTS

| | | | | |
|---|---|---|---|---|
| 6,687,696 B2 * | 2/2004 | Hofmann | .......... | G06F 17/30699 |
| 8,111,923 B2 * | 2/2012 | Csurka | .............. | G06K 9/00624 |
| | | | | 382/170 |
| 8,159,235 B2 * | 4/2012 | Lynch | ................... | G01R 27/02 |
| | | | | 324/691 |
| 8,509,517 B2 * | 8/2013 | Blanton | ................. | G06T 7/001 |
| | | | | 382/100 |
| 8,527,448 B2 * | 9/2013 | Vladislav | ........... | G06F 17/2785 |
| | | | | 706/12 |
| 8,532,401 B2 * | 9/2013 | Kato | ................... | G06K 9/4638 |
| | | | | 382/132 |
| 8,892,539 B2 * | 11/2014 | Anand | ............. | G06F 17/30654 |
| | | | | 707/705 |
| 8,930,782 B2 * | 1/2015 | Benware | ........ | G01R 31/318544 |
| | | | | 382/149 |
| 9,355,196 B2 * | 5/2016 | Muraoka | ................ | G06N 7/005 |
| 9,405,928 B2 * | 8/2016 | Amarendran | ....... | G06F 21/6218 |
| 2010/0014756 A1 * | 1/2010 | Kato | .................... | G06K 9/4638 |
| | | | | 382/173 |
| 2012/0233128 A1 * | 9/2012 | Solmer | ............. | G06K 9/00442 |
| | | | | 707/661 |

(Continued)

*Primary Examiner* — Naum B Levin
(74) *Attorney, Agent, or Firm* — Park, Vaughan, Fleming & Dowler LLP; Laxman Sahasrabuddhe (57) ABSTRACT

Systems and techniques for identifying failure mechanisms based on a population of scan diagnostic reports is described. Given a population of scan diagnostic reports, a mixed membership model can be used for computing a topic distribution for each portion of each scan diagnostic report and a feature distribution for each topic. The failure mechanisms can be identified based on the topic distributions for the portions of the scan diagnostic reports and the feature distributions for the topics.

15 Claims, 5 Drawing Sheets

---

Use a mixed membership model to compute a topic distribution for each portion of each scan diagnostic report and a feature distribution for each topic, wherein the mixed membership model can comprise (1) a first set of latent random variables that represent topic distributions for portions of scan diagnostic reports, (2) a second set of latent random variables that represent feature distributions for topics, and (3) a third set of observable random variables that represent features in the scan diagnostic reports
602

↓

Identify failure mechanisms based on the topic distribution for each portion of each scan diagnostic report and the feature distribution for each topic
604

(56) References Cited

U.S. PATENT DOCUMENTS

| | | | |
|---|---|---|---|
| 2014/0149411 A1* | 5/2014 | Anand | G06F 17/30705 707/737 |
| 2014/0279727 A1* | 9/2014 | Baraniuk | G06N 99/005 706/11 |
| 2014/0307958 A1* | 10/2014 | Wang | G06K 9/6256 382/159 |
| 2015/0012255 A1* | 1/2015 | Li | G05B 17/02 703/6 |
| 2016/0328656 A1* | 11/2016 | Yuan | G06N 7/005 |

* cited by examiner

Use a mixed membership model to compute a topic distribution for each portion of each scan diagnostic report and a feature distribution for each topic, wherein the mixed membership model can comprise (1) a first set of latent random variables that represent topic distributions for portions of scan diagnostic reports, (2) a second set of latent random variables that represent feature distributions for topics, and (3) a third set of observable random variables that represent features in the scan diagnostic reports
602

Identify failure mechanisms based on the topic distribution for each portion of each scan diagnostic report and the feature distribution for each topic
604

IDENTIFYING FAILURE MECHANISMS BASED ON A POPULATION OF SCAN DIAGNOSTIC REPORTS

RELATED APPLICATION

This application claims benefit of U.S. Provisional Application Ser. No. 62/208,096, filed on 21 Aug. 2015, by the same inventors, the contents of which are herein incorporated by reference in their entirety for all purposes.

BACKGROUND

Technical Field

This disclosure relates to improving integrated circuit (IC) manufacturing yield. More specifically, this disclosure relates to identifying a failure mechanism based on a population of scan diagnostic reports.

Related Art

Advances in process technology and a practically unlimited appetite for consumer electronics have fueled a rapid increase in the size and complexity of IC designs. Manufactured ICs go through rigorous testing, and the percentage (or fraction) of manufactured ICs that pass testing is called the yield. When a new manufacturing process is introduced or a new IC is manufactured using an existing manufacturing process, the yield can be significantly lower than what is considered to be economically acceptable. Therefore, improving the yield of manufactured ICs to an acceptable level is very important for meeting time-to-market and time-to-volume objectives for the IC.

If we can identify the reason why manufactured ICs are failing a given set of tests, then this information can be used to increase the yield by making appropriate adjustments to the manufacturing process and/or to the circuit design. Scan diagnosis uses the circuit design information, Automatic Test Pattern Generation (ATPG) patterns, and the pass/fail results from the tests to identify specific locations in the circuit design that may contain defects. Unfortunately, the output of scan diagnosis is ambiguous and it is difficult, if not impossible, to directly use the scan diagnosis output to improve the yield. The ambiguity in the output of the scan diagnosis is referred to as diagnostic noise, and the reasons for the diagnostic noise are twofold. First, more than one location in the circuit design can explain why a manufactured IC failed a particular test. Therefore, the scan diagnosis output provides a set of possible locations that may have caused a particular test to fail, but does not identify which of the possible locations is the actual reason for the test failure. Second, in each possible location identified by the scan diagnosis there could be many possible defects, and any one of those defects may have resulted in the test failure. For example, scan diagnosis may identify a chain of inverters as the reason for test failure, but any one of a large number of defects in the chain of inverters (e.g., specific cells, vias, wires, etc. within the chain of inverters) could have caused the test to fail.

In a publication entitled "Determining a Failure Root Cause Distribution From a Population of Layout-Aware Scan Diagnostic Results," by Brady Benware, Chris Schuermyer, Manish Sharma, and Thomas Herrmann, *IEEE Design & Test of Computers*, p. 8-18, February 2012, the authors describe an approach for identifying the root causes for test failures (this approach is also described in U.S. Pub. No. 2012/0297264). The approach uses a Bayes Net Mixture Model to represent the features and uses a frequentist approach (specifically expectation maximization) to learn the parameters of the model. The Bayes Net Mixture Model restricts the topic assignments to only be a mixture of the original set of features. For example, a real silicon defect may be due to a specific type and orientation of a via routed around certain type of standard cell. If the input features are {cells, vias}, then the above-mentioned mixture model will force assignment into exactly one feature, e.g., a particular cell, a particular via, etc. Some other approaches use supervised machine learning or clustering with hard assignments to try to remove diagnostic noise.

Common approaches for removing diagnostic noise are often focused on identifying only a single type of defect at a time, and can incorrectly identify the root cause. Therefore, what are needed are techniques and systems to remove diagnostic noise more effectively, thereby enabling the yield of manufactured ICs to be quickly increased to an acceptable level.

SUMMARY

Some embodiments disclosed herein are able to better remove diagnostic noise because topic assignments can be a mixture of distributions of features, which is more similar to how actual defects exist. Specifically, some embodiments described herein use a mixed membership model which enables these embodiments to be more robust against a local extremum of an optimization objective, i.e., embodiments described herein are more likely to find the global minimum or maximum of an optimization objective (which can correspond to an accurate determination of the actual failure mechanism distribution). Additionally, because embodiments described herein don't need to ensure independence of input features, the embodiments are able to more robustly accommodate a larger universe of features.

A population of scan diagnostic reports can be produced by testing a set of manufactured integrated circuits. Each scan diagnostic report can include a set of features that are potential defects. Some embodiments described herein use a mixed membership model to compute a topic distribution for each scan diagnostic report (or each portion of each scan diagnostic report) and a feature distribution for each topic, wherein the mixed membership model comprises (1) a first set of latent random variables that represent topic distributions for each scan diagnostic report (or each portion of each scan diagnostic report), (2) a second set of latent random variables that represent feature distributions for topics, and (3) a third set of observable random variables that represent features in the population of scan diagnostic reports. The latent random variables for the topic distributions and the feature distributions can be computed by using a Bayesian approach, e.g., by using sampling-based methods (Gibbs sampling for example) or by using variational methods. Next, the embodiments can identify failure mechanisms based on the computed topic distributions and the computed feature distributions. The identified failure mechanisms can be used to improve integrated circuit manufacturing yield.

In some embodiments, the mixed membership model can be based on a Latent Dirichlet Allocation (LDA) model. In some embodiments, each failure mechanism can be one of: an interconnect open defect, an interconnect short defect, a defect in a standard cell, or a defect in a via. In some embodiments, identifying failure mechanisms can comprise computing aggregate weights for features based on the topic distribution for each scan diagnostic report and the feature distribution for each topic, and sorting features in decreasing order of their aggregate weights.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of an EDA Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are for illustrative purposes only and are not intended to limit the embodiments to the forms disclosed.

Some EDA software tools enable circuit designers to describe the functionality that the circuit designers want to implement. These tools also enable circuit designers to perform what-if planning to refine functionality, check costs, etc. During logic design and functional verification, the HDL (hardware description language), e.g., SystemVerilog, code can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically coupled.

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Some embodiments described herein can identify a set of failure mechanisms based on a population of scan diagnostic reports. The identified failure mechanisms can be used to improve manufacturing yield by modifying the circuit design (e.g., by removing polygon geometries in the circuit design that are causing manufacturing problems) and/or by adjusting process parameters of the semiconductor manufacturing process.

Identifying Failure Mechanisms

A manufactured IC is typically subjected to a set of tests, e.g., tests generated using ATPG. The output of these tests is summarized in a scan diagnostic report. Each scan diagnostic report can correspond to one or more tests. Some embodiments described herein identify the true failure mechanisms that exist in a population of scan diagnostic reports. Typically, a scan diagnostic report will have one correct answer for the failure mechanism and often many wrong answers (the wrong answers are called "diagnostic noise" in this disclosure). In most cases the wrong answers overwhelm the right answers and make it very difficult to know which answer is correct. Further, the wrong answers can be highly correlated and often look to be systematic even though they are not the cause of the yield loss.

Some embodiments described herein use a population of scan diagnostic reports to cluster the systematic failure mechanisms in a set of reports and simultaneously assign individual diagnostic reports to their most likely failure mechanisms. These embodiments solve the problem of identifying the true systematic failure mechanism from amongst the diagnostic noise. Specifically, some embodiments recast the true failure mechanism identification problem as a topic modeling problem in natural language processing. Specifically, each "topic" in the topic modeling problem corresponds to a mixed membership of potential failure mechanisms. In other words, each "topic" can correspond to a set of potential failure mechanisms (i.e., features), wherein each failure mechanism is associated with a probability value.

Some embodiments can begin by mapping features from each diagnostic report into their relative importance compared to their expectations. The expectations can be derived from the whole design or empirically. Next, each feature and each diagnostic report (or each portion of each diagnostic report) can be treated as their equivalent representation in natural language processing (word and document, respectively). The embodiments can then create a Topic Model using Latent Dirichlet Allocation (LDA) or any other Topic Model or mixed membership model to the corpus of diagnostic reports and use a Bayesian approach for learning parameters using Gibbs sampling, variational inference, etc. to estimate the parameter values (which are analogous to the Failure Mechanism Pareto). Finally, the embodiments can map the topics (based on the estimated parameter values in the Topic Model) to a representation of Failure Mechanisms understood by experts in diagnostics and yield learning.

Embodiments described in this disclosure have many advantages over conventional yield improvement approaches. First, embodiments described in this disclosure enable automatic extraction of the Failure Mechanism Pareto (the Failure Mechanism Pareto provides the probabilities for a set of Failure Mechanisms, which can then be used to identify the most common Failure Mechanisms). Second, because the embodiments treat the Failure Mechanism identification problem as a topic modeling problem (or more generally a mixed membership modeling problem), the embodiments can uncover complex relationships that wouldn't be understood if a fixed universe of failure mechanisms were required. Third, the mixed membership model used in this disclosure is extensible to new features so long as they are weighted appropriately. Fourth, using a mixed membership model also provides the likelihood that an individual diagnostic report belongs to a given topic (in a variation, each candidate in a diagnostic report can be assigned a likelihood of belonging to a given topic). Finally, a mixed membership model, e.g., LDA, enables generation of a Pareto that has a more complex distribution of features than if the feature were assumed to be the true failure mechanism independent of other failure mechanisms. Specifically, some embodiments described herein use a random variable that is a distribution of distributions of the features. In contrast, the approach described in the document "Determining a Failure Root Cause Distribution From a Population of Layout-Aware Scan Diagnostic Results," by Brady Benware, Chris Schuermyer, Manish Sharma, and Thomas Herrmann, *IEEE Design & Test of Computers*, p. 8-18, February 2012" does not have such a random variable (the random variable "$RC_i$" in above-mentioned document corresponds merely to a distribution of the features).

Figure 1:
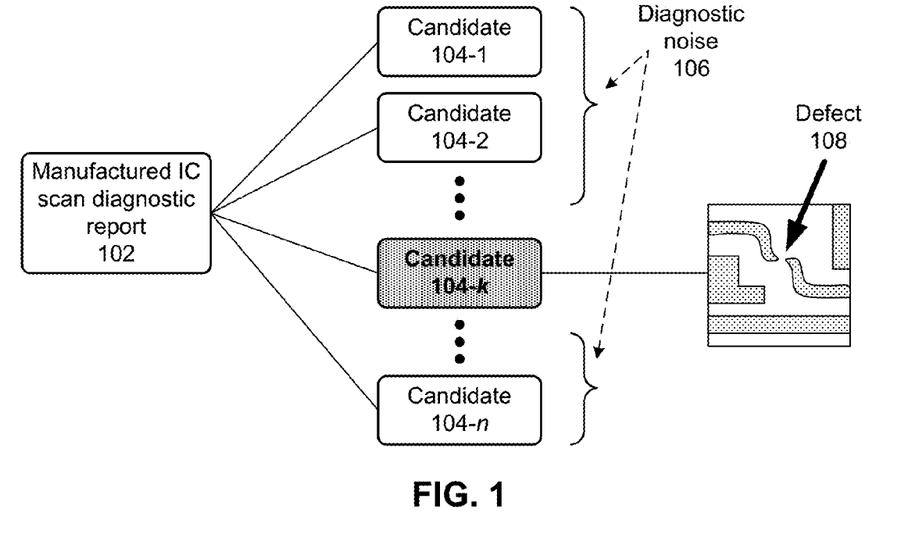
FIG. 1 illustrates the failure mechanism identification problem in accordance with some embodiments described herein.

FIG. 1 illustrates the failure mechanism identification problem in accordance with some embodiments described herein. A manufactured IC scan diagnostic report 102 can contain information about a test failure. The test failure may be caused by one of many possible failure mechanisms (shown in FIG. 1 as candidates 104-1 through 104-$n$). The possible failure mechanisms may be enumerated in a scan diagnostic report that corresponds to the failed test. However, only one of the candidates, e.g., candidate 104-$k$ (which corresponds to interconnect open defect 108), has actually occurred in the manufactured IC, and is the reason why the manufactured IC failed the test. Types of failure mechanisms include, but are not limited to, interconnect open defects, interconnect short defects (also known as bridge defects because these involve a short between two wires), defects within cells, and via defects. The other possible candidates that did not cause the test to fail constitute the diagnostic noise 106.

In summary, the failure mechanism identification problem can be described as the problem of identifying the actual failure mechanisms from a set of possible failure mechanisms by removing the diagnostic noise based on analyzing a population of scan diagnostic reports.

Figure 2:
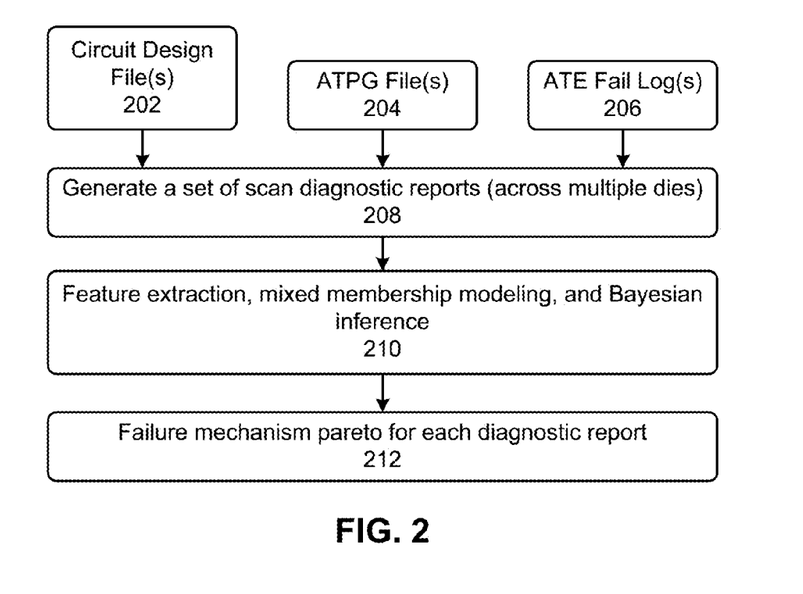
FIG. 2 illustrates an overall process for identifying failure mechanisms in accordance with some embodiments described herein.

FIG. 2 illustrates an overall process for identifying failure mechanisms in accordance with some embodiments described herein. Circuit design file(s) 202 describe the circuit design. ATPG file(s) 204 contain information about the tests that are performed on the circuit design. The automatic test equipment (ATE) fail log file(s) 206 contain the result of the tests, i.e., which tests passed and which failed. Based on these three inputs, the system can generate a set of scan diagnostic reports (operation 208), wherein each scan diagnostic report can correspond to one or more test failures by a particular manufactured IC. Note that the scan diagnostic reports can be generated for multiple dies. In other words, multiple manufactured ICs (that are based on the same circuit design) can be tested by using the ATE, and scan diagnostic reports for all of these tests can be generated in operation 208.

Next, feature extraction, mixed membership modeling, and Bayesian inference can be performed based on the set of scan diagnostics (operation 210). The term "feature" refers to a potential mechanism that is strongly correlated to the root cause of failure. Specifically, in yield analysis, a feature can be thought of as the basic unit of the circuit design that can be identified as the root cause of the failure. Examples of features include, but are not limited to, an instance of a standard cell, a segment of a particular net that may have an open defect, segments of a pair of nets that may have a bridge defect, a via, etc.

Feature extraction involves assigning weights to different features. In general, the embodiments can use any technique for assigning weights that is consistent with the physical failure model. For example, in some embodiments, feature extraction can be performed as follows: (1) assign feature weights to standard cell types based on the total number of cell instances in the design (e.g., a cell type is associated with a weight that is proportional to the number of instances of the cell type that are present in the circuit design), (2) assign a feature weight to the bridge layer based on the total bridge layer critical area in the circuit design, (3) assign feature weights to via types based on the total number of via instances in the design (e.g., a via type is associated with a weight that is proportional to the number of instances of the via type that are present in the circuit design), and (4) assign a feature weight to the open layer based on the total open layer critical area in the circuit design.

Next, a mixed membership model can be used to determine the failure mechanism Pareto 212. Mixed membership models have been used in natural language processing for automatically determining "topics" in a set of documents. In the natural language processing context, each "topic" corresponds to a set of words, wherein each word in the topic is associated with a probability value (or a weight). Some embodiments described herein map diagnostic reports to "documents" and features to "words." Under this mapping, the mixed membership model can be used to determine (1) a set of "topics" based on the set of scan diagnostic reports and (2) for each scan diagnostic report, a set of "topics" with corresponding probability values (or weights). Recall that each "topic" corresponds to a set of failure mechanisms with corresponding weights. Finally, for each scan diagnostic report, a failure mechanism Pareto can be created based on (1) the set of "topics" associated with the scan diagnostic report, wherein each associated topic has a probability value, and (2) the set of failure mechanism in each "topic" in the set of "topics," wherein each failure mechanism has a probability value.

Figure 3:
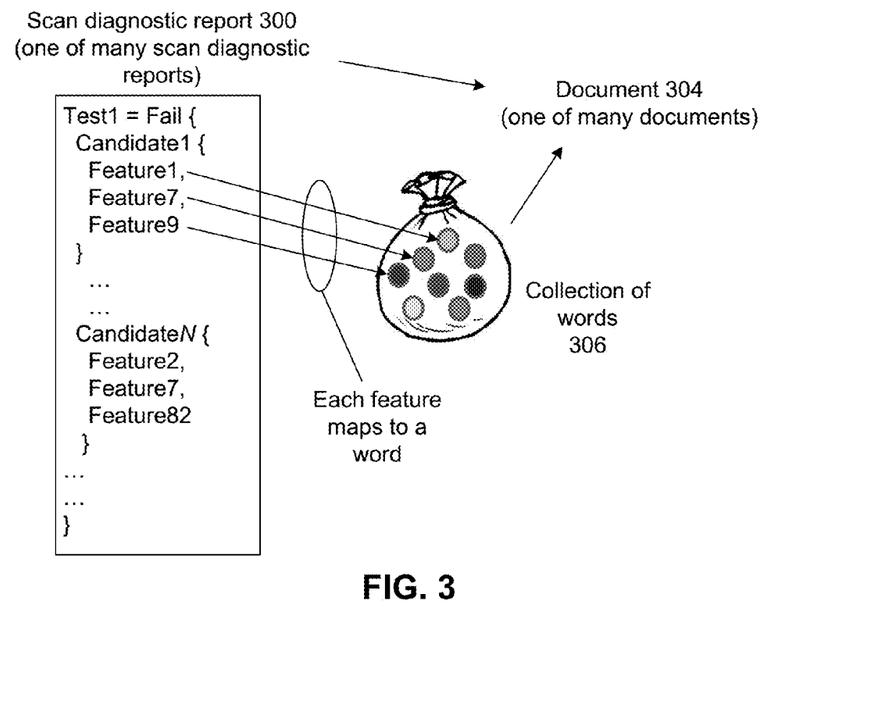
FIG. 3 illustrates a correspondence between topic modeling in natural language processing and failure mechanism identification in accordance with some embodiments described herein.

FIG. 3 illustrates a correspondence between topic modeling in natural language processing and failure mechanism identification in accordance with some embodiments described herein. Scan diagnostic report 300 shows that a test called "Test1" failed, and N candidates that may have caused the test failure have been identified. Each candidate can include multiple features. For example, a particular wire interconnect can be a candidate, and different segments in the wire interconnect can be the individual features. As shown in FIG. 3, each scan diagnostic report can map to a document (e.g., scan diagnostic report 300 can map to document 304), and each feature can map to a word. Document 304 (which corresponds to scan diagnostic report 300) is a collection of words 306, wherein each word in the collection of words 306 corresponds to a feature that is mentioned in scan diagnostic report 300. Each word in document 304 can also have a weight, which is the weight of the corresponding feature. The feature weights are used in the mixed membership model.

In a variation of this embodiment, a scan diagnostic report can be represented as a set of sub-documents, wherein each sub-document corresponds to a portion of the scan diagnostic report. The features within the portion of the scan diagnostic report can correspond to the words in the corresponding sub-document. For example, each candidate (e.g., candidates "Candidate1" through "CandidateN" in FIG. 3) can correspond to a sub-document, and the features within each candidate can correspond to the words in the sub-document.

Mixed membership modeling can then be applied to the set of documents (such as document 304) to determine a set of topics and their respective frequencies of occurrence. Once the set of topics has been determined based on the set of documents, the failure mechanisms corresponding to the topics can be reported. Note that, in a mixed membership model, a topic is a distribution over a set of words.

Figure 4:
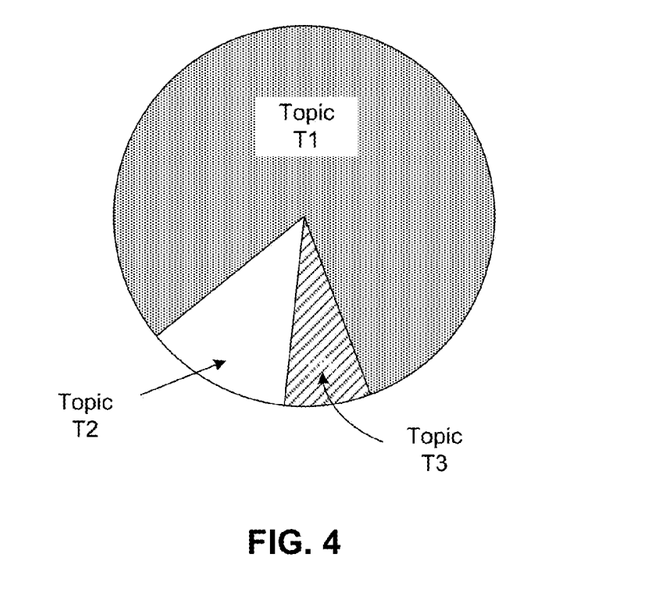
FIG. 4 illustrates an example of topic distribution and feature distribution in accordance with some embodiments described herein.

FIG. 4 illustrates an example of topic distribution and feature distribution in accordance with some embodiments described herein. The pie chart shown in FIG. 4 can correspond to the topic distribution for a scan diagnostic report. In embodiments that map a portion of a scan diagnostic report to a document, the topic distribution shown in FIG. 4 can correspond to the corresponding portion of the scan diagnostic report. The pie chart has three sections, and each corresponds to a different topic. The sizes of the three sections correspond to the weight of the respective topics. Thus, topic T1 has a weight of 0.80, topic T2 has a weight of 0.12, and topic T3 has a weight of 0.08. Each topic can be associated with a feature distribution. For example, topic T1 can comprise features "BridgeM3," "BridgeM4," and "BridgeM1," which have weights 0.34, 0.01, and 0.01, respectively (note that the weights do not have to add up to 1); topic T2 can comprise features "BridgeM4," "Cel-1ADD," and "BridgeM2," which have weights 0.01, 0.01, and 0.01, respectively; and topic T3 can comprise features "CellXOR" and "OpenM2," which have weights 0.22 and 0.17, respectively.

Once the topic distribution for each scan diagnostic report (or the topic distribution for each portion of each scan diagnostic report) and the feature distribution for each topic have been computed, the system can then determine the weight of each feature by aggregating the weight across all scan diagnostic reports. For example, the weight contribution for feature "BridgeM4" from the pie chart shown in FIG. 4 is 0.8*0.01+0.12*0.01—in this expression the "0.8" and "0.12" values are the weights of topics T1 and T2, and the two "0.01" values are the weights of feature "BridgeM4" in topics T1 and T2, respectively. The weight contributions from other pie charts (which correspond to other scan diagnostic reports or correspond to other portions of the same or other scan diagnostic reports) can be determined, and the aggregate weight for feature "BridgeM4" across the population of scan diagnostic reports can be computed. Once the aggregate weights for all of the features have been computed, the features can be sorted in decreasing order of their weights to obtain the failure mechanism Pareto.

Figure 5A:
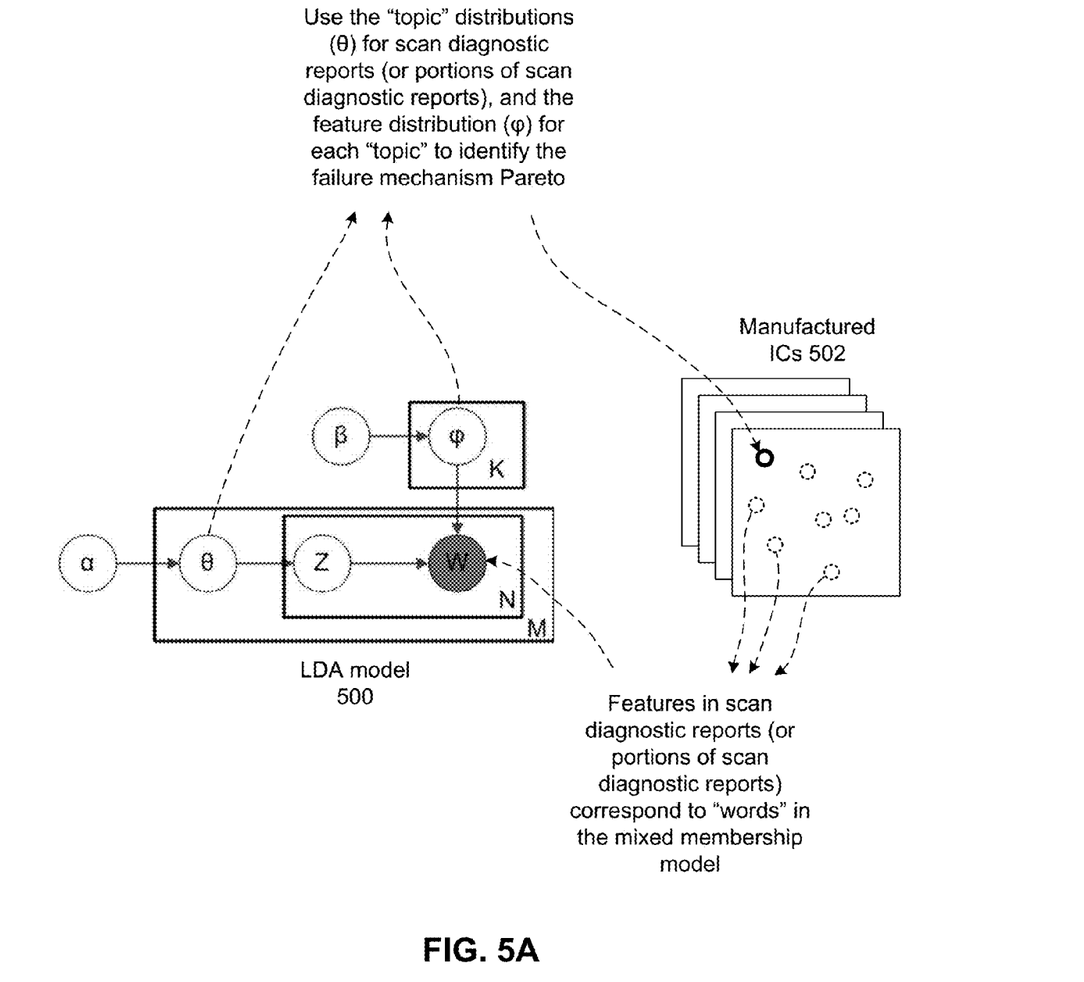
FIGS. 5A and 5B illustrate how a mixed membership model can be used to compute the topic distributions and the feature distributions in accordance with some embodiments described herein.
Figure 5B:
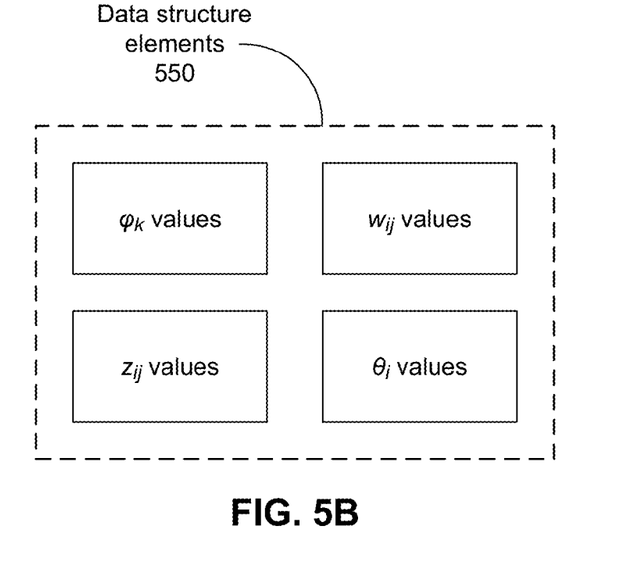

FIGS. 5A and 5B illustrate how a mixed membership model can be used to compute the topic distributions and feature distributions in accordance with some embodiments described herein. Manufactured ICs 502 can be tested to generate a set of scan diagnostic reports. As explained above, each scan diagnostic report includes a set of features. In some embodiments, the dashed circles in the manufactured ICs 502 correspond to the features in the scan diagnostic report. A mixed membership model, such as LDA model 500, can be used to determine the topic and feature distributions. LDA model 500 is illustrated using plate notation. In the plate notation a plate or rectangle is used to group variables into a subgraph that repeat together, and a number is drawn on the plate to represent the number of repetitions of the subgraph in the plate. In other words, the subgraph within a plate is duplicated that many times, and the variables in the subgraph are indexed by the repetition number, and any links that cross a plate boundary are replicated once for each subgraph repetition. In LDA model 500, $\alpha$ is the parameter of the Dirichlet prior on the per-scan-diagnostic-report topic distribution, $\beta$ is the parameter of the Dirichlet prior on the per-topic feature distribution, $\theta_i$ is the topic distribution for scan diagnostic report i, $\phi_k$ is the feature distribution for topic k, $z_{ij}$ is the topic for the $j^{th}$ feature in scan diagnostic report i, and $w_{ij}$ is a specific feature. M is the number of scan diagnostic reports (i.e., $1 \leq i \leq M$), $N_i$ is the number of features in scan diagnostic report i (i.e., $1 \leq j \leq N_i$) and K is the number of topics (i.e., $1 \leq k \leq K$). The unshaded circles represent latent variables and the shaded circle (that corresponds to the features) represents observable variables. The directed edges between variables indicate dependencies between the variables that are modeled in LDA model 500.

The system can use a mixed membership model, such as LDA model 500, to compute the topic distributions $\theta_i$ for scan diagnostic reports i, $1 \leq i \leq M$, and the feature distributions $\phi_k$ for topics k, $1 \leq k \leq K$. Specifically, data structure elements 550 shown in FIG. 5B can store $\theta_i$ values, $\phi_k$ values, $z_{ij}$ values, and $w_{ij}$ values in computer memory.

The $\theta_i$ and $\phi_k$ values can be computed by a processor executing a series of instructions for computing latent variables based on the observable variables in a mixed membership model (e.g., by using a Bayesian approach), wherein values of the latent and observable variables are stored in data structure elements 550 in computer memory that is accessible by the processor. Next, the processor can compute the aggregate weights for each feature based on the topic distributions and feature distributions, and then the processor can use the aggregate weights to generate the failure mechanism Pareto.

The mixed membership model shown in FIG. 5A is for illustration purposes only and is not intended to limit the scope of the embodiments described herein. The scope of the embodiments described herein include modifications and variations of the LDA-based mixed membership model illustrated in FIG. 5A, and also include other mixed membership models that, upon reading this disclosure, would be apparent to a person having ordinary skill in the art.

For example, in a variation, the mixed membership model can associate a topic with a portion of a scan diagnostic report. In this variation, $\theta_i$ can be the topic distribution for a particular scan diagnostic report portion i, M can be the total number of scan diagnostic report portions over all scan diagnostic reports (i.e., $1 \leq i \leq M$), and $N_i$ can be the number of features in scan diagnostic report portion I (i.e., $1 \leq j \leq N_i$). In some embodiments, a scan diagnostic report portion can correspond to a potential candidate that was identified as a possible cause for the test failure (as explained in reference to FIG. 3, each candidate includes a set of features). In some embodiments, additional latent variables may be added to the mixed membership model shown in FIG. 5A.

Embodiments described herein use Bayesian approaches to compute the latent variables (e.g., $\theta_i$ and $\phi_k$) based on the observable variables (e.g., $w_{ij}$). This is in direct contrast to the frequentist approach (specifically, expectation maximization) used in the document entitled "Determining a Failure Root Cause Distribution From a Population of Layout-Aware Scan Diagnostic Results," by Brady Benware, Chris Schuermyer, Manish Sharma, and Thomas Herrmann, p. 8-18, *IEEE Design & Test of Computers*, February 2012, and is also in direct contrast to the frequentist approach (specifically, expectation maximization) used in U.S. Pub. No. 2012/0297264.

Details of Bayesian techniques (such as Gibbs sampling methods, Markov Chain Monte Carlo approximations, and variational methods) that can be used for computing the latent variables (e.g., $\theta_i$ and $\phi_k$) based on the observable variables (e.g., $w_{ij}$) in mixed membership models (which are sometimes referred to as partial membership models) can be found in a number of books and articles, such as, Airoldi, Edoardo, David M. Blei, Elena A. Erosheva, and Stephen E. Fienberg, "Handbook of Mixed Membership Models and Their Applications," CRC Press, 2015. In general, Bayesian approaches and frequentist approaches are not equivalent to each other. Therefore, the latent variable values (e.g., $\theta_i$ and $\phi_k$) computed by Bayesian approaches can be different from the latent variable values computed by frequentist approaches such as expectation maximization.

Figure 6:
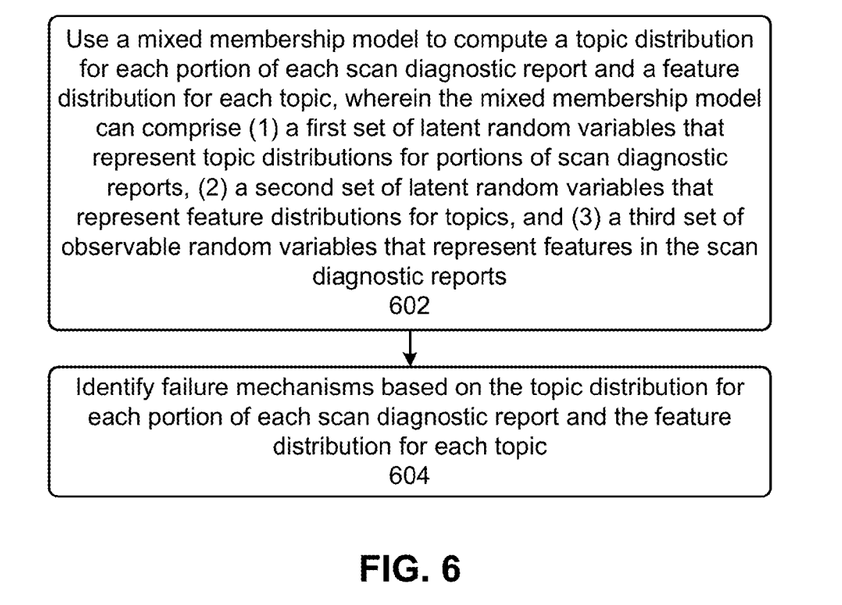
FIG. 6 illustrates a process for identifying failure mechanisms based on a population of scan diagnostic reports in accordance with some embodiments described herein.

FIG. 6 illustrates a process for identifying failure mechanisms based on a population of scan diagnostic reports in accordance with some embodiments described herein. The process can begin by using a mixed membership model to compute a topic distribution for each portion of each scan diagnostic report and a feature distribution for each topic, wherein the mixed membership model (which can be based on an LDA model) can comprise (1) a first set of latent random variables that represent topic distributions for portions of scan diagnostic reports, (2) a second set of latent random variables that represent feature distributions for topics, and (3) a third set of observable random variables that represent features in the population of scan diagnostic reports (operation 602). In this disclosure, the term "portion of a scan diagnostic report" can refer to only a part of the scan diagnostic report (e.g., "Candidate1" in FIG. 3) or can refer to the entire scan diagnostic report (e.g., the entire scan diagnostic report 300 in FIG. 3). In some embodiments, the topic distributions and the feature distributions are computed using a Bayesian approach.

Next, failure mechanisms can be identified based on the topic distribution for each portion of each scan diagnostic report and the feature distribution for each topic (operation 604). In some embodiments, each failure mechanism is one of: an interconnect open defect, an interconnect short defect, a defect in a standard cell, or a defect in a via. In some embodiments, identifying the failure mechanisms can comprise (1) computing aggregate weights for features based on the topic distribution for each portion of each scan diagnostic report and the feature distribution for each topic, and (2) sorting features in decreasing order of their aggregate weights. The identified failure mechanisms can then be used for improving integrated circuit manufacturing yield.

Yield Analysis System

Figure 7:
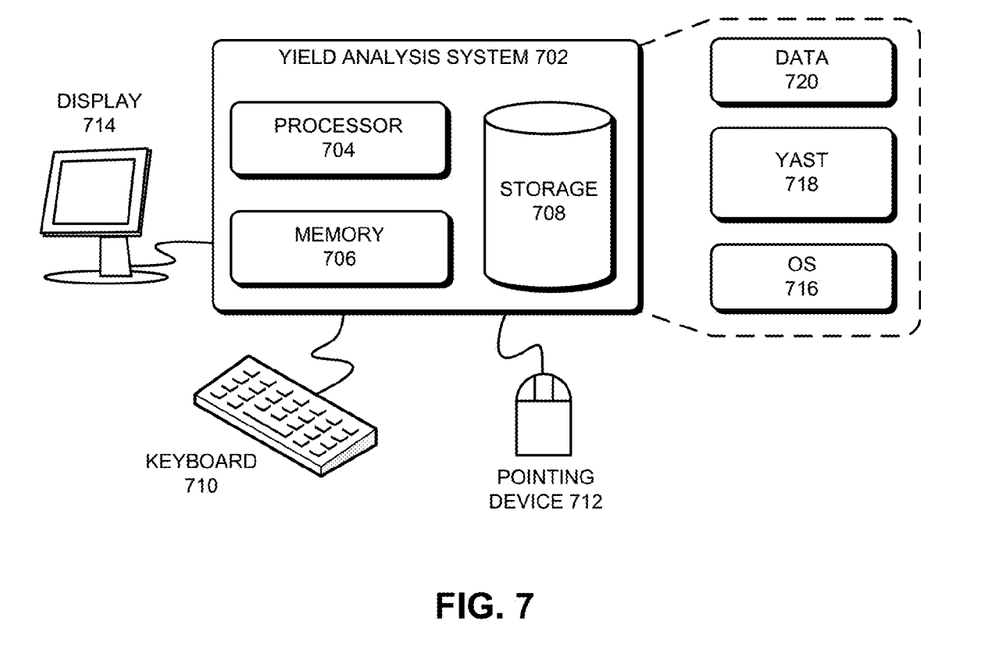
FIG. 7 illustrates a yield analysis system in accordance with some embodiments described herein.

The term "yield analysis system" refers to a hardware based system that is capable of computing latent random variables based on observable random variables in a mixed membership model. FIG. 7 illustrates a yield analysis system in accordance with some embodiments described herein. Yield analysis system 702 can include processor 704, memory 706, and storage device 708. Specifically, memory locations in memory 706 can be addressable by processor 706, thereby enabling processor 704 to access (e.g., via load/store instructions) and manipulate (e.g., via logical/floating point/arithmetic instructions) the data stored in memory 706. Yield analysis system 702 can be coupled to display device 714, keyboard 710, and pointing device 712. Storage device 708 can store operating system 716, yield analysis software tool 718, and data 720. Data 720 can include input required by yield analysis software tool 718 and/or output generated by yield analysis software tool 718.

Yield analysis system 702 may automatically (or with user help) perform one or more operations that are implicitly or explicitly described in this disclosure. For example, yield analysis system 702 can load yield analysis software tool 718 into memory 706, and yield analysis software tool 718 can then be used to identify failure mechanisms based on a population of scan diagnostic reports.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In a yield analysis software tool in a computer, a method for identifying failure mechanisms based on a population of scan diagnostic reports, wherein the population of scan diagnostic reports are generated by testing a set of manufactured integrated circuits, the method comprising:

the yield analysis software tool in the computer using a mixed membership model to compute a topic distribution for each portion of each scan diagnostic report and a feature distribution for each topic, wherein the mixed membership model comprises (1) a first set of latent random variables that represent topic distributions for portions of scan diagnostic reports, (2) a second set of latent random variables that represent feature distributions for topics, and (3) a third set of observable random variables that represent features in the population of scan diagnostic reports; and the yield analysis software tool in the computer identifying failure mechanisms based on the computed topic distribution for each portion of each scan diagnostic report and the computed feature distribution for each topic, wherein the identified failure mechanisms can be used to improve integrated circuit manufacturing yield.

2. The method of claim 1, wherein the mixed membership model is based on a Latent Dirichlet Allocation (LDA) model.

3. The method of claim 1, wherein each failure mechanism is one of:

an interconnect open defect, an interconnect short defect, a defect in a standard cell, or a defect in a via.

4. The method of claim 1, wherein said identifying failure mechanisms comprises:

computing aggregate weights for features based on the topic distribution for each portion of each scan diagnostic report and the feature distribution for each topic; and sorting features in decreasing order of their aggregate weights.

5. The method of claim 1, wherein the topic distribution and the feature distribution are computed using a Bayesian approach.

6. A non-transitory computer-readable storage medium storing instructions for a yield analysis software tool that, when executed by a processor, cause the processor to perform a method for identifying failure mechanisms based on a population of scan diagnostic reports, wherein the population of scan diagnostic reports are generated by testing a set of manufactured integrated circuits, the method comprising:

using a mixed membership model to compute a topic distribution for each portion of each scan diagnostic report and a feature distribution for each topic, wherein the mixed membership model comprises (1) a first set of latent random variables that represent topic distributions for portions of scan diagnostic reports, (2) a second set of latent random variables that represent feature distributions for topics, and (3) a third set of observable random variables that represent features in the population of scan diagnostic reports; and identifying failure mechanisms based on the computed topic distribution for each portion of each scan diagnostic report and the computed feature distribution for each topic, wherein the identified failure mechanisms can be used to improve integrated circuit manufacturing yield.

7. The non-transitory computer-readable storage medium of claim 6, wherein the mixed membership model is based on a Latent Dirichlet Allocation (LDA) model.

8. The non-transitory computer-readable storage medium of claim 6, wherein each failure mechanism is one of: an interconnect open defect, an interconnect short defect, a defect in a standard cell, or a defect in a via.

9. The non-transitory computer-readable storage medium of claim 6, wherein said identifying failure mechanisms comprises:

computing aggregate weights for features based on the topic distribution for each portion of each scan diagnostic report and the feature distribution for each topic; and sorting features in decreasing order of their aggregate weights.

10. The non-transitory computer-readable storage medium of claim 6, wherein the topic distribution and the feature distribution are computed using a Bayesian approach.

11. A yield analysis system, comprising:

a processor; and a non-transitory computer-readable storage medium storing instructions that, when executed by the processor, cause the processor to perform a method for identifying failure mechanisms based on a population of scan diagnostic reports, wherein the population of scan diagnostic reports are generated by testing a set of manufactured integrated circuits, the method comprising:

using a mixed membership model to compute a topic distribution for each portion of each scan diagnostic report and a feature distribution for each topic, wherein the mixed membership model comprises (1) a first set of latent random variables that represent topic distributions for portions scan diagnostic reports, (2) a second set of latent random variables that represent feature distributions for topics, and (3) a third set of observable random variables that represent features in the population of scan diagnostic reports; and identifying failure mechanisms based on the computed topic distribution for each portion of each scan diagnostic report and the computed feature distribution for each topic, wherein the identified failure mechanisms can be used to improve integrated circuit manufacturing yield.

12. The yield analysis system of claim 10, wherein the mixed membership model is based on a Latent Dirichlet Allocation (LDA) model.

13. The yield analysis system of claim 10, wherein each failure mechanism is one of: an interconnect open defect, an interconnect short defect, a defect in a standard cell, or a defect in a via.

14. The yield analysis system of claim 10, wherein said identifying failure mechanisms comprises:

computing aggregate weights for features based on the topic distribution for each portion of each scan diagnostic report and the feature distribution for each topic; and sorting features in decreasing order of their aggregate weights.

15. The yield analysis system of claim 10, wherein the topic distribution and the feature distribution are computed using a Bayesian approach.

* * * * *